(12) United States Patent
Chang et al.

(10) Patent No.: US 11,676,885 B2
(45) Date of Patent: Jun. 13, 2023

(54) SEMICONDUCTOR DEVICE PACKAGING LEADFRAME ASSEMBLY AND METHOD THEREFOR

(71) Applicant: NXP B.V., Eindhoven (NL)

(72) Inventors: Yeou Chian Chang, Taipei (TW); Chao Hui Huang, Kaohsiung (TW)

(73) Assignee: NXP B.V.

( * ) Notice: Subject to any disclaimer, the term of this patent is extended or adjusted under 35 U.S.C. 154(b) by 73 days.

(21) Appl. No.: 17/308,101

(22) Filed: May 5, 2021

(65) Prior Publication Data
US 2022/0359350 A1  Nov. 10, 2022

(51) Int. Cl.
*H01L 23/495* (2006.01)
*H01L 21/56* (2006.01)
*H01L 23/31* (2006.01)
*H01L 23/00* (2006.01)

(52) U.S. Cl.
CPC ........ *H01L 23/49513* (2013.01); *H01L 21/56* (2013.01); *H01L 23/3107* (2013.01); *H01L 23/49541* (2013.01); *H01L 23/49582* (2013.01); *H01L 24/32* (2013.01); *H01L 24/48* (2013.01); *H01L 24/73* (2013.01); *H01L 24/83* (2013.01); *H01L 2224/32245* (2013.01); *H01L 2224/48177* (2013.01); *H01L 2224/73265* (2013.01)

(58) Field of Classification Search
None
See application file for complete search history.

(56) References Cited

U.S. PATENT DOCUMENTS

| | | | |
|---|---|---|---|
| 6,184,575 B1 * | 2/2001 | Chillara | H01L 23/49548 257/E23.125 |
| 6,246,111 B1 | 6/2001 | Huang et al. | |
| 8,368,189 B2 | 2/2013 | Sirinorakul | |
| 2003/0006055 A1 * | 1/2003 | Chien-Hung | H05K 3/341 174/557 |
| 2004/0232527 A1 * | 11/2004 | Ito | H01L 24/97 257/E21.504 |
| 2013/0020688 A1 * | 1/2013 | Pan | H01L 21/4828 257/676 |
| 2013/0140686 A1 | 6/2013 | Pan et al. | |
| 2021/0013137 A1 | 1/2021 | Ge et al. | |
| 2022/0172961 A1 | 6/2022 | Lin | |

\* cited by examiner

*Primary Examiner* — Michelle Mandala
*Assistant Examiner* — Jordan M Klein

(57) ABSTRACT

A method of manufacturing a semiconductor device is provided. The method includes forming a package leadframe assembly. The package leadframe includes a plurality of leads. An adhesive is placed on a portion of the plurality of leads. A die pad is placed onto the adhesive. A portion of the die pad overlaps the portion of the plurality of leads. A semiconductor die is attached to the die pad. A molding compound encapsulates the semiconductor die and a portion of the package leadframe assembly.

18 Claims, 8 Drawing Sheets

SEMICONDUCTOR DEVICE PACKAGING LEADFRAME ASSEMBLY AND METHOD THEREFOR

BACKGROUND

Field

This disclosure relates generally to semiconductor devices, and more specifically, to semiconductor device packaging leadframe assembly and method of forming the same.

Related Art

Semiconductor devices are often found in a large spectrum of electronic products—from sewing machines to washing machines, from automobiles to cellular telephones, and so on. Many of these semiconductor devices are produced in high volumes to drive costs down. Factors such as manufacturing processes may be optimized for product costs but could adversely affect product performance and reliability. As technology progresses, semiconductor manufacturing continues to seek ways to improve performance and reliability in these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device packaging leadframe assembly. The leadframe assembly includes a flagless (e.g., no die pad) package leadframe having long half-etched leads. A separate die pad is attached to an inner portion of the half-etched leads by way of a non-conductive adhesive material to form the leadframe assembly. A top surface of the die pad is downset from a top surface of the leads when the leadframe assembly is formed. A semiconductor die is attached at the top surface of the die pad allowing for shorter bond wire lengths when interconnected with leadframe leads. A bottom surface of the die pad is substantially coplanar with bottom portions of the leads and are exposed after encapsulation. By attaching the die pad to the inner portion of the long half-etched leads in this manner, the long half-etch leads are reinforced. A bonding region at the top surface of the leads is sufficiently rigid to form highly reliable stitch bonds. The highly reliable stitch bonds allow for improved yields, lower costs, and greater overall reliability.

Figure 1:
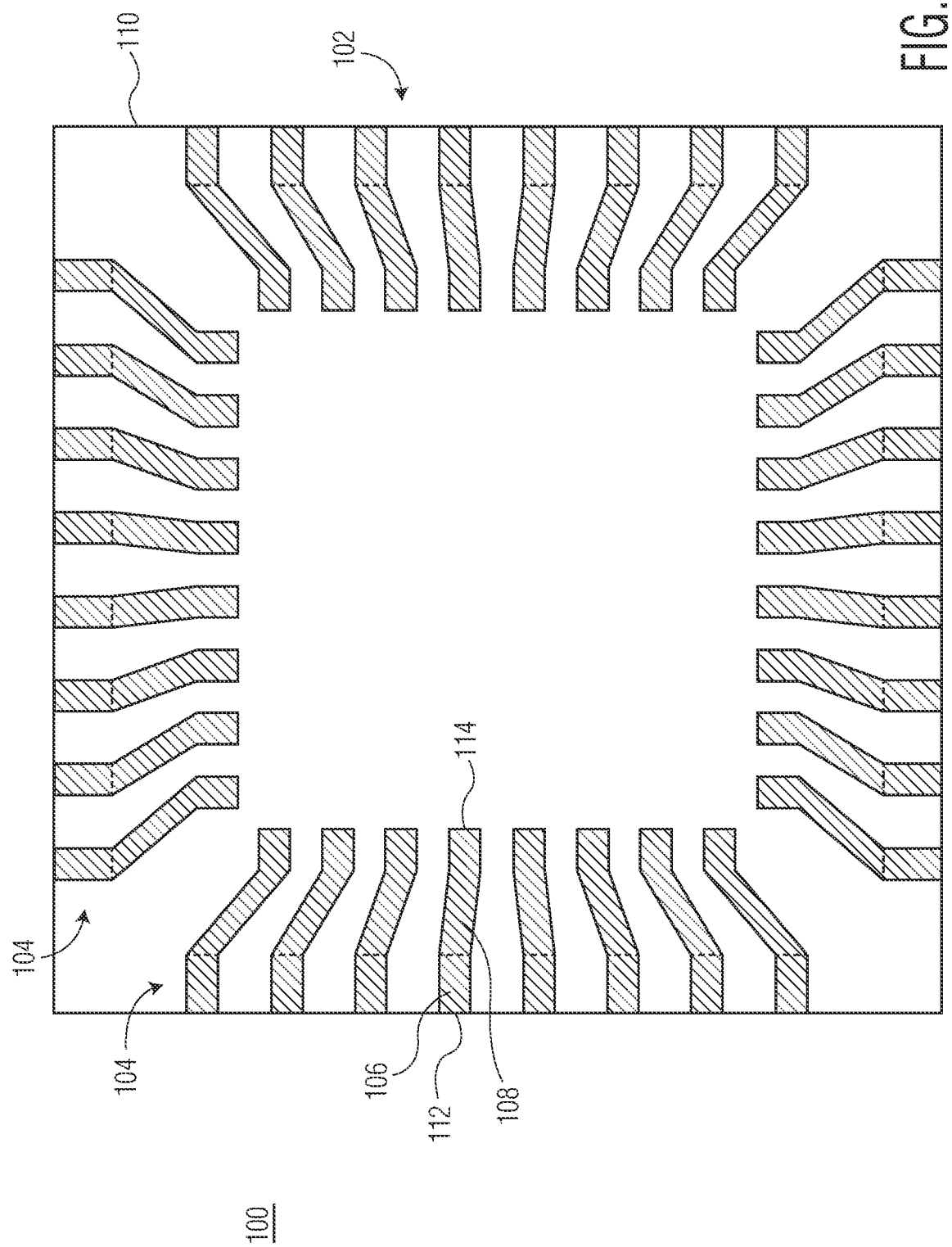
FIG. 1 illustrates, in a simplified plan view, an example semiconductor device having a leadframe assembly at stages of manufacture in accordance with an embodiment.

FIG. 1 illustrates, in a simplified bottom-side-up plan view, an example semiconductor device 100 having a leadframe assembly at a stage of manufacture in accordance with an embodiment. At this stage, the semiconductor device 100 includes a package leadframe 102 shown in a bottom-side-up orientation. In this embodiment, the leadframe 102 is provided without a die pad. The leadframe 102 includes a plurality of leads 104 having an outer end 112 proximate to an outer perimeter 110 and an inner end 114. The outer perimeter 110 of the leadframe 102 depicts an anticipated outer perimeter location of a singulated package encapsulant at a subsequent stage of manufacture, for example. Portions of the leadframe 102 outside of the outer perimeter 110 such as dam bars interconnected to the plurality of leads 104 and the like are not shown for illustration purposes.

Each lead of the plurality of leads 104 includes an outer full thickness portion 106 proximate to the outer perimeter 110 and an inner half-etched, reduced thickness portion 108. As depicted in FIG. 1, the outer portion 106 of leads 104 extends from the outer perimeter 110 to the dashed line and the inner portion 108 extends from the dashed lined to the inner end 114. The inner half-etched, reduced thickness portion 108 is etched from the bottom side to reduce the lead thickness. The leadframe 102 may be formed from any suitable metal materials, such as copper, nickel, aluminum, iron, or alloys thereof, for example. The leadframe 102 may be bare, partially plated, or plated with another metal or an alloy such as silver, gold, palladium, and the like. The term "half-etched," as used herein, refers to a method of selectively reducing the thickness of portions of the leads by a predetermined amount.

Figure 2:
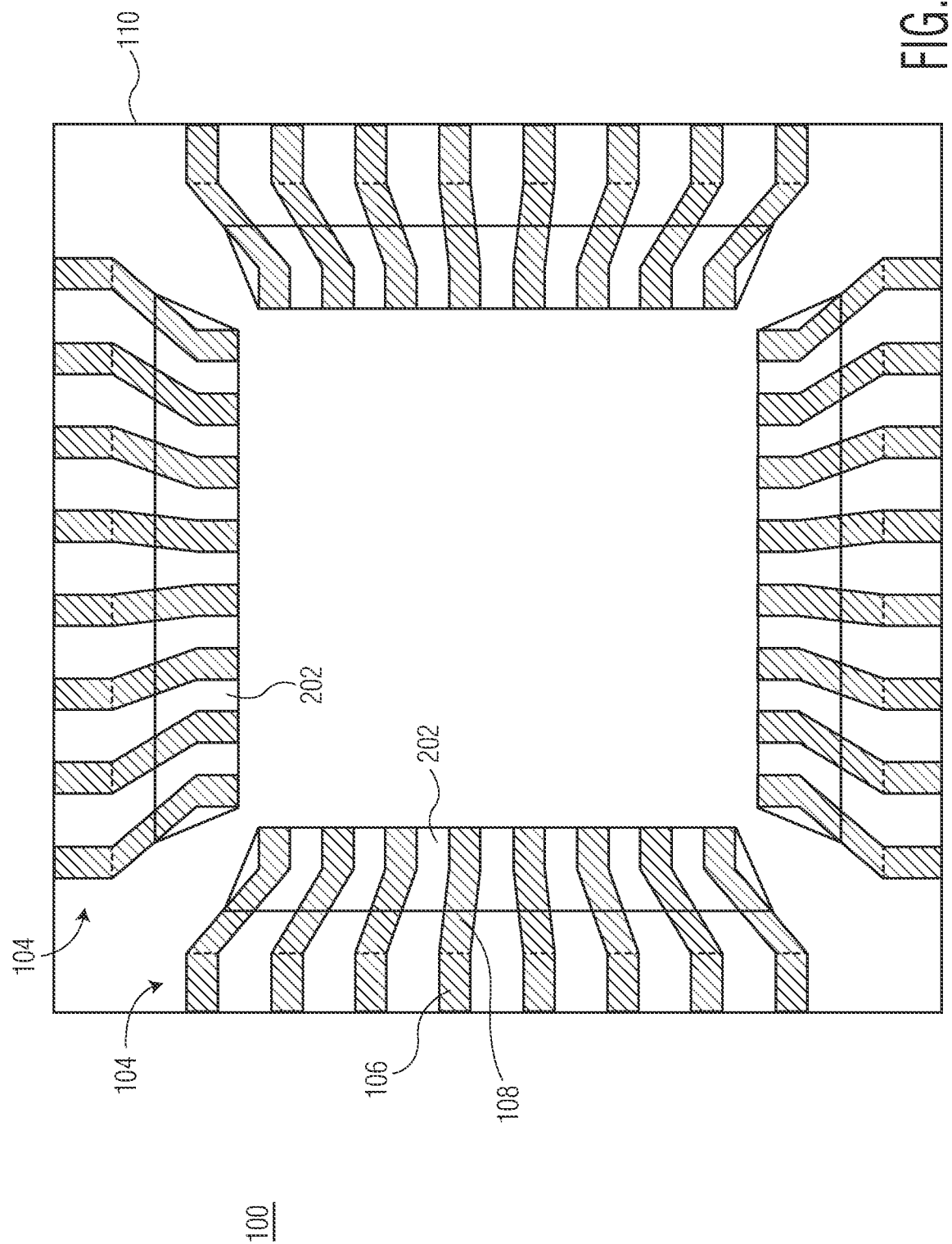
FIG. 2 illustrates, in a simplified plan view, the example semiconductor device having a leadframe assembly at a subsequent stage of manufacture in accordance with an embodiment.

FIG. 2 illustrates, in a simplified bottom-side-up plan view, the example semiconductor device 100 having a leadframe assembly at a subsequent stage of manufacture in accordance with an embodiment. At this stage, the semiconductor device 100 includes a non-conductive adhesive material 202 applied on portions of the leads 104 of the leadframe 102. In this embodiment, the adhesive material 202 is applied onto the inner half-etched portions 108 of the leads 104 and located proximate to the inner ends (114) of the leads 104 of the leadframe 102. The adhesive material may be dispensed or applied in a film form (e.g., die attach film, double-side tape). In this embodiment, it may be desirable for the adhesive material 202 to have predetermined thickness.

Figure 3:
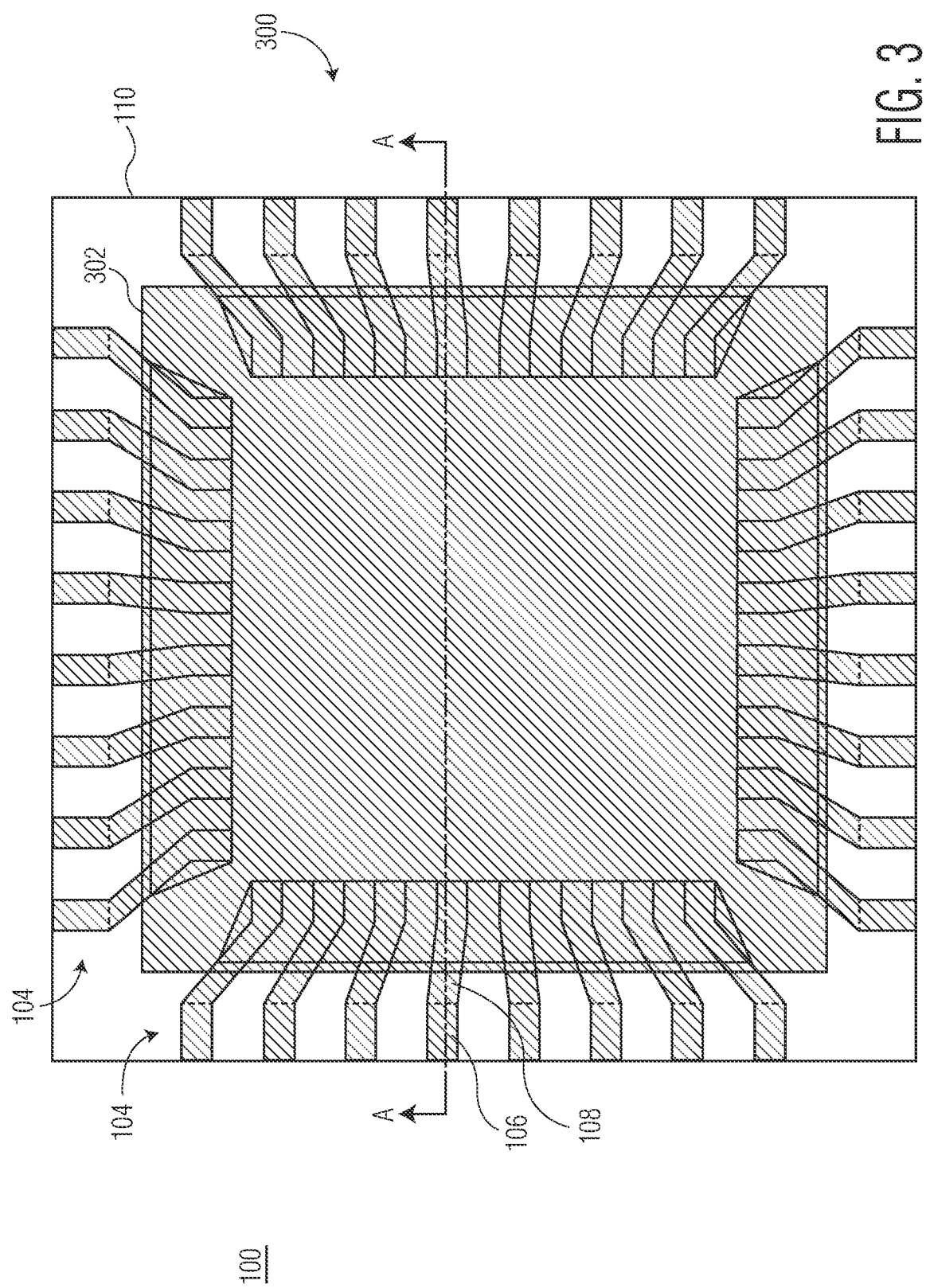
FIG. 3 illustrates, in a simplified plan view, the example semiconductor device having a leadframe assembly at a subsequent stage of manufacture in accordance with an embodiment.

FIG. 3 illustrates, in a simplified bottom-side-up plan view, the example semiconductor device 100 having a leadframe assembly at a subsequent stage of manufacture in accordance with an embodiment. At this stage, the semiconductor device 100 includes a separate die pad 302 placed onto the adhesive material (202), forming a package leadframe assembly 300. In this embodiment, the die pad 302 is formed separately and attached to the leadframe 102 by way of the adhesive material 202. The die pad 302 may be formed having any suitable shape or size such that outer portions of the die pad 302 overlap portions of the leads 104 and are attached to the leads 104 of the leadframe 102 by way of the adhesive material 202. The die pad 302 may be formed from a stamped or etched metal sheet. For example, the die pad 302 may be manufactured in a manner consistent with the manufacture of a package leadframe. Because the adhesive material 202 is non-conductive, the die pad 302 remains electrically isolated from the leads 104. In this embodiment, the package leadframe assembly 300 may be characterized as a package leadframe assembly configured for a quad flat no-lead (QFN) type package. In other embodiments, the package leadframe assembly 300 may be configured for other package types. Simplified cross-sectional views of the example semiconductor device 100 taken along line A-A are shown in stages of manufacture depicted in FIG. 4 through FIG. 8.

FIG. 4 through FIG. 8 illustrate, in simplified cross-sectional views, the example semiconductor device 100 taken along line A-A of FIG. 3 at stages of manufacture in accordance with an embodiment.

Figure 4:
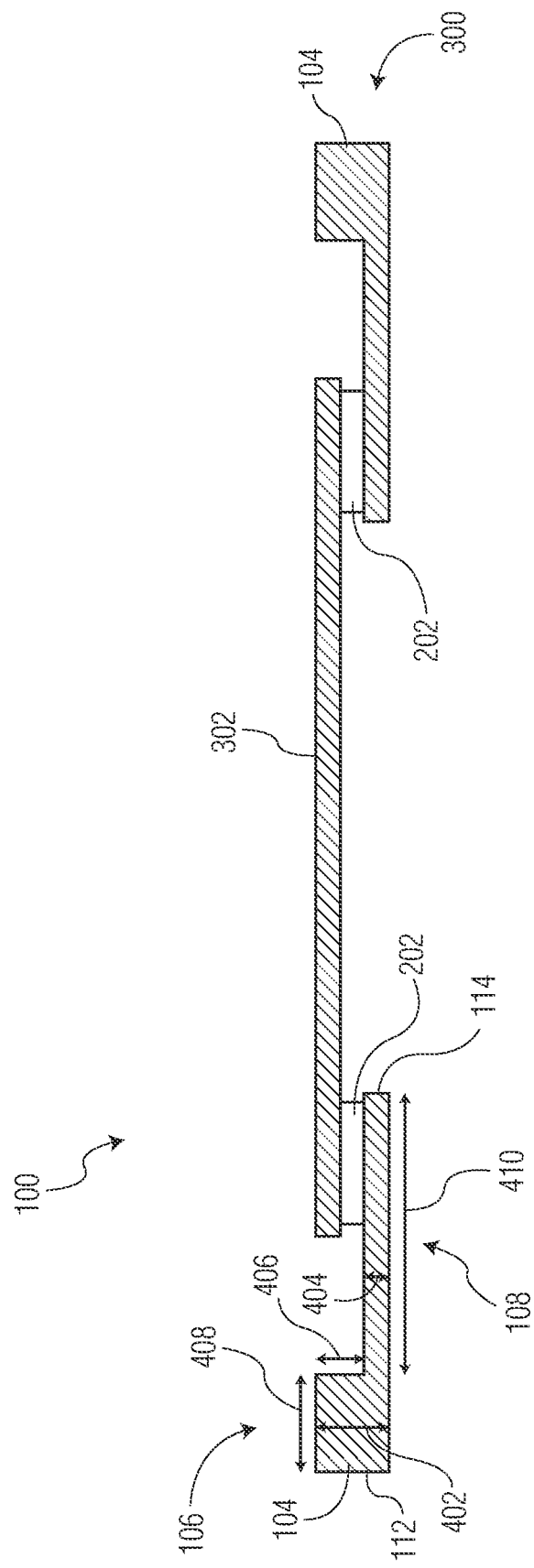
FIG. 4 through FIG. 8 illustrate, in simplified cross-sectional views, the example semiconductor device at stages of manufacture in accordance with an embodiment.

FIG. 4 illustrates, in a simplified bottom-side-up cross-sectional view, the example semiconductor device 100 taken along line A-A at the stage of manufacture depicted in FIG. 3 in accordance with an embodiment. At this stage, the semiconductor device 100 depicted in FIG. 4 includes the includes the die pad 302 attached to the bottom side of the inner half-etched portions 108 of the leads 104 by way of the non-conductive adhesive material 202 to form the package leadframe assembly 300. Outer portions of the die pad 302 overlap portions of the inner half-etched portions 108 of the leads 104. The leads 104 as depicted in FIG. 4 have an outer end 112 and an inner end 114. Each of leads 104 includes an outer portion 106 and an inner portion 108. The outer portion 106 is proximate to the outer end 112 and is characterized as a full-thickness portion having a thickness 402 and a linear length 408. The inner portion 108 extends from the outer portion to the inner end 114 and is characterized as a half-etched, reduced thickness portion 108 having a thickness 404 and a linear length 410.

The inner portion 108 is etched from the bottom side to reduce the lead thickness by a predetermined amount 406. For example, it may be desirable to reduce the lead thickness by a predetermined amount 406 equal to the thickness of the die pad 302 plus the thickness of the adhesive 202 such that the bottom surface of the die pad 302 and bottom surface of the outer portion 106 of the leads 104 are substantially coplanar. In this embodiment, the leads 104 may be characterized as long half-etched leads having the linear length 410 of the reduced thickness portion 108 being longer than the linear length 408 of the full-thickness portion 106.

Figure 5:
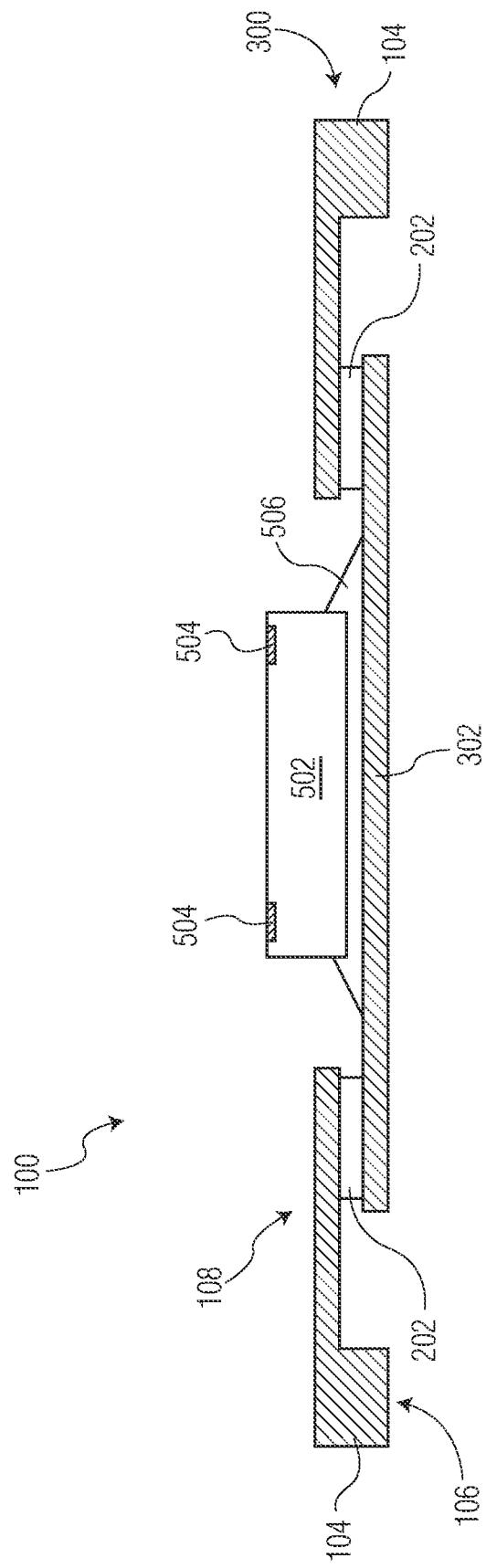

FIG. 5 illustrates, in a simplified cross-sectional view, the example semiconductor device 100 taken along line A-A at a subsequent stage of manufacture in accordance with an embodiment. At this stage, the semiconductor device 100 depicted in FIG. 5 is oriented (flipped) top-side-up and a semiconductor die 502 is mounted on the die pad 302 of the package leadframe assembly 300. In this embodiment, a backside of the semiconductor die 502 is attached to the top surface of the die pad 302 by way of a die attach material 506. The die attach material 506 may be a paste, film, or solder material, for example. Because the die pad 302 is attached to the bottom side of the inner half-etched portion 108 of the leads 104 by way of the non-conductive adhesive material 202, the top surface of the die pad 302 is downset relative to the top surface of the leads allowing for shorter bond wire lengths when interconnecting the semiconductor die 502 with the leadframe assembly 300, for example.

The semiconductor die 502 has an active side (e.g., major side having circuitry, bond pads) and a backside (e.g., major side opposite of the active side). As depicted in the cross-sectional view of FIG. 5, the semiconductor die 502 is mounted on the die pad 302 in an active-side-up orientation, for example. The semiconductor die 502 includes bond pads 504 located at the active side of the semiconductor die and configured for connection to the leads 104. The semiconductor die 502 may be formed from any suitable semiconductor material, such as silicon, germanium, gallium arsenide, gallium nitride, and the like. The semiconductor die 502 may further include any digital circuits, analog circuits, RF circuits, memory, processor, the like, and combinations thereof at the active side.

Figure 6:
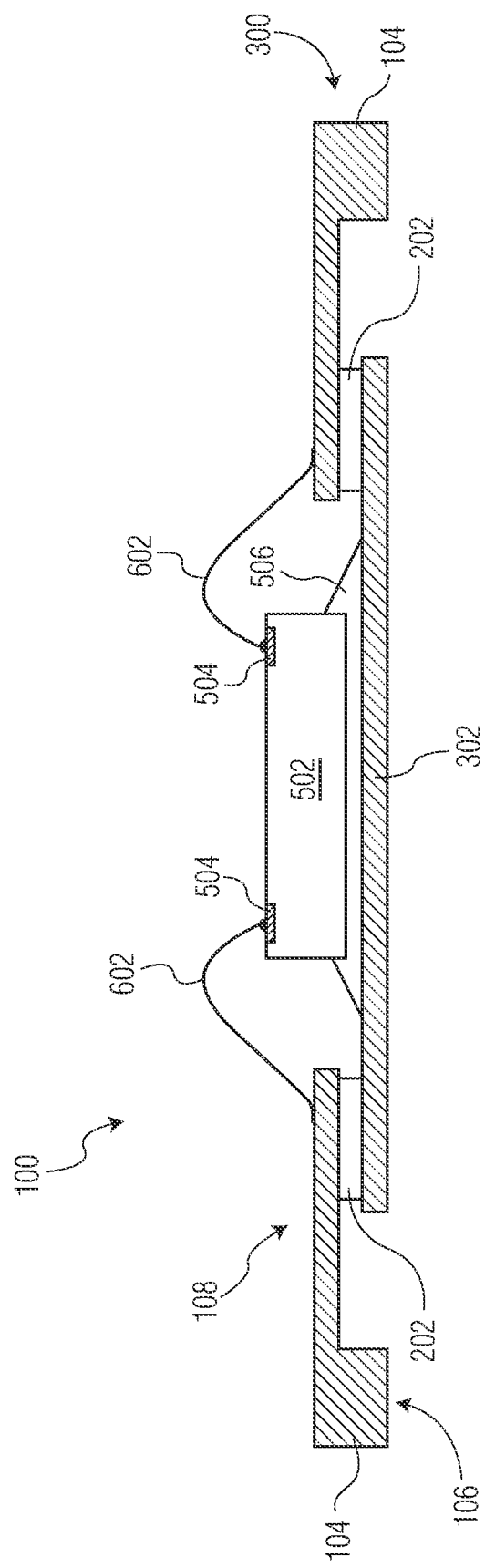

FIG. 6 illustrates, in a simplified cross-sectional view, the example semiconductor device 100 taken along line A-A at a subsequent stage of manufacture in accordance with an embodiment. At this stage, the semiconductor device 100 depicted in FIG. 6 includes the bond pads 504 of the semiconductor die 502 interconnected to leads 104 by way of bond wires 602. In this embodiment, a first end of the bond wires 602 is attached to the bond pads 504 by way of a ball bond and a second end of the bond wires 602 is attached to a bonding region at the top surface of the reduced thickness portion 108 of the leads 104 by way of a stitch bond. The bonding region may be characterized as general location at the top surface of the reduced thickness portion 108 which overlaps an outer portion of die pad 302. Because the die pad 302 is attached to the reduced thickness portion 108 of the leads 104 by way of the adhesive 202, the bonding region at the top surface of the leads 104 is sufficiently rigid to form highly reliable stitch bonds.

Figure 7:
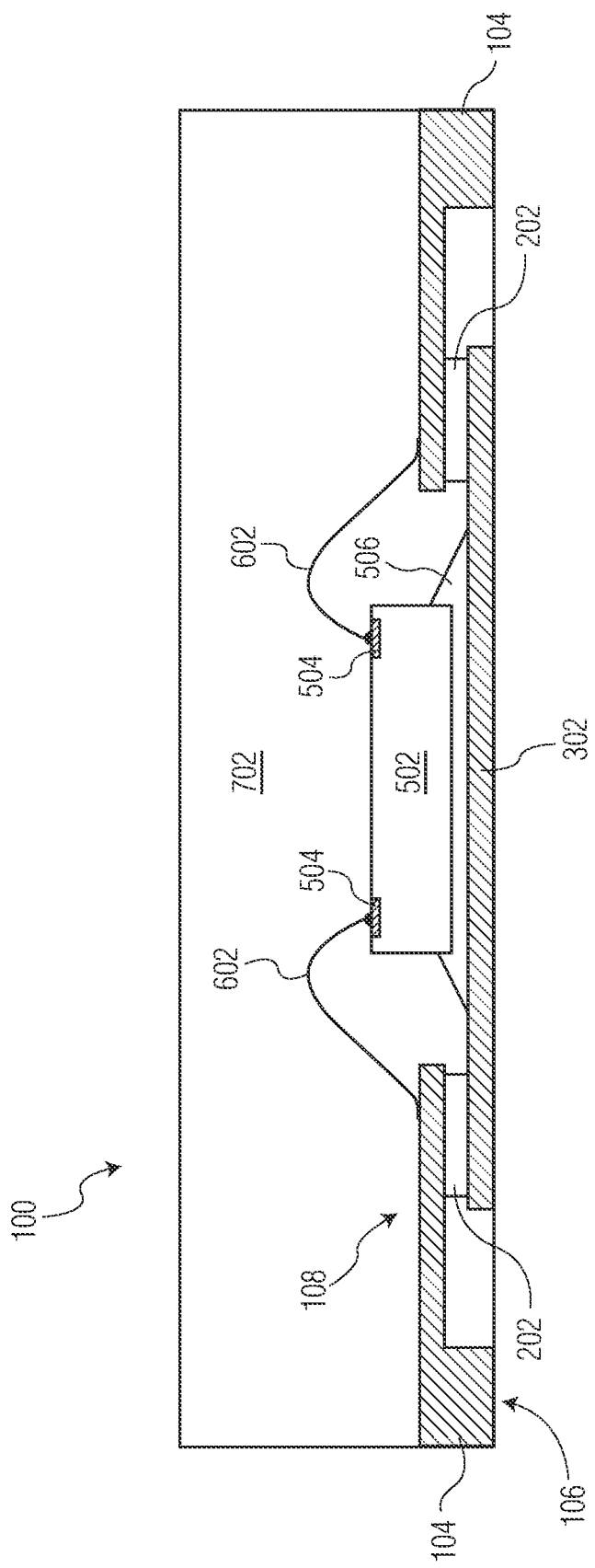

FIG. 7 illustrates, in a simplified cross-sectional view, the example semiconductor device 100 taken along line A-A at a subsequent stage of manufacture in accordance with an embodiment. At this stage, the semiconductor device 100 depicted in FIG. 7 includes an encapsulant 702 encapsulating the semiconductor die 502 and portions of the die pad 302 and leads 104. The encapsulant 702 may be an epoxy molding compound dispensed during an injection molding encapsulation operation, for example. In this embodiment, the bottom surface of the die pad 302 and the bottom surface of the outer portion 106 of the leads 104 may remain exposed after encapsulating with the encapsulant 702. For example, with the bottom surface of the die pad 302 exposed, connection to an external heatsink or printed circuit board (PCB) is facilitated. Likewise, with the bottom surface of the outer portion 106 of the leads 104 exposed, interconnection of the leads 104 with pads on the PCB is facilitated.

In some embodiments, when the bottom surface of the die pad 302 and bottom surface of the outer portion 106 of the leads 104 are not substantially coplanar, the semiconductor device 100 may be subjected to a subsequent back-grind operation to sufficiently expose the bottom surface of the die pad 302 and bottom surface of the outer portion 106 of the leads 104. In some embodiments, the bottom surface of the die pad 302 and bottom surface of the outer portion 106 of the leads 104 may have been pre-plated with a solderable material (e.g., silver, palladium-gold) at a stage of manufacture before encapsulating with the encapsulant 702, for example. Accordingly, the semiconductor device 100 may be singulated (e.g., from a strip or panel) once the plated surfaces are sufficiently exposed.

Figure 8:
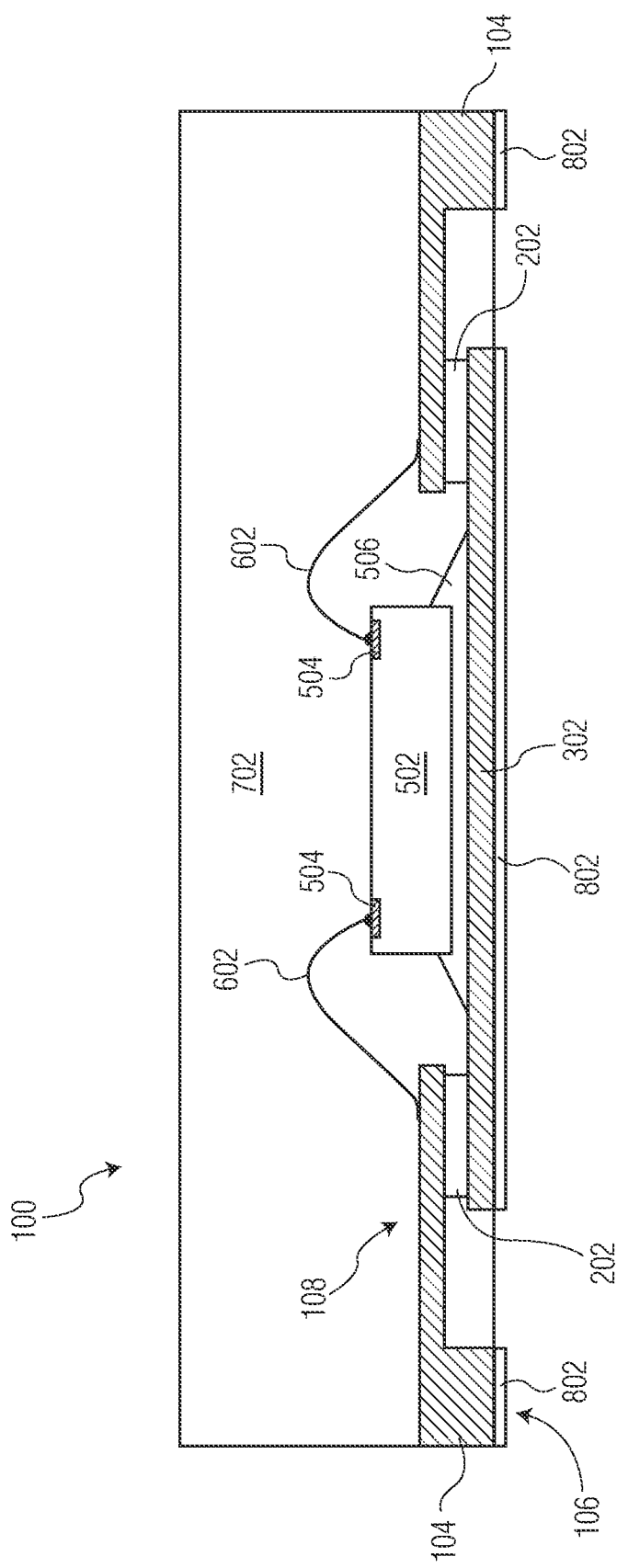

FIG. 8 illustrates, in a simplified cross-sectional view, the example semiconductor device 100 taken along line A-A at a subsequent stage of manufacture in accordance with an embodiment. At this stage, the semiconductor device 100 depicted in FIG. 8 includes the bottom surface of the die pad 302 and bottom surface of the outer portion 106 of the leads 104 exposed after encapsulating the semiconductor die 502 and portions of the die pad 302 and leads 104 with the encapsulant 702. After encapsulating the semiconductor die 502 and portions of the die pad 302 and leads 104 with the encapsulant 702, the exposed bottom surface of the die pad 302 and bottom surface of the outer portion 106 of the leads 104 are plated with a conductive material layer 802. For example, the exposed portions of the bottom surface of the die pad 302 and bottom surface of the outer portion 106 of the leads 104 may be electroplated with a tin alloy material to facilitate solder adhesion. In a subsequent step, the semiconductor device 100 may be singulated into individual devices suitable for attachment to a printed circuit board.

Generally, there is provided, a method including forming a package leadframe assembly comprising: providing a leadframe including a plurality of leads, the plurality of leads having a first major side and a second major side; applying an adhesive on a portion of the first major side of the plurality of leads; providing a die pad having a first major surface and a second major surface; placing the first major surface of the die pad onto the adhesive, a portion of the die pad overlapping the portion of the first major side of the plurality of leads; attaching a semiconductor die to the first major surface of the die pad; and encapsulating with a molding compound the semiconductor die and a portion of the package leadframe assembly. Each lead of the plurality of leads may include a first portion at a first end of the lead proximate to an outer perimeter of the leadframe and a second portion extending from the first portion to a second end of the lead, the first portion having a first thickness and the second portion having a second thickness less than the first thickness. The second portion of each lead of the plurality of leads may be etched on the first major side to form the second thickness. The applying the adhesive on the portion of the first major side of the plurality of leads may be applying the adhesive on the second portion of the first major side of the plurality of leads. After placing the first major surface of the die pad onto the adhesive, the second major surface of the die pad may be substantially coplanar with the first portion of each lead at the first side of the plurality of leads. The method may further include connecting a bond pad on the semiconductor die with a lead of the plurality of leads by way of a bond wire. The method may further include after encapsulating with the molding compound, plating exposed surfaces of the plurality of leads and the die pad with a tin material. The plurality of leads and the die pad may be formed from a copper or copper alloy material. The package leadframe assembly may be configured for a quad flat no-lead (QFN) type package.

In another embodiment, there is provided, a semiconductor device including a leadframe including a plurality of leads having a top side and a bottom side, an inner portion of each lead of the plurality of leads half etched at the bottom side; an adhesive applied on the inner portion of the plurality of leads at the bottom side; a die pad having a top surface and a bottom surface, the top surface of the die pad attached to the plurality of leads by way of the adhesive; a semiconductor die attached to the top surface of the die pad; and a molding compound encapsulating the semiconductor die, a portion of the plurality of leads, and a portion of the die pad. Each lead of the plurality of leads may further include an outer portion adjacent to the inner portion and proximate to an outer perimeter of the leadframe, the outer portion having first thickness and the inner portion having a second thickness less than the first thickness. The bottom surface of the die pad may be substantially coplanar with the outer portion of each lead at the bottom side of the plurality of leads. The bottom surface of the die pad and the outer portion of each lead at the bottom side of the plurality of leads may be exposed through the molding compound. The exposed surfaces of the die pad and outer portion of each lead at the bottom side of the plurality of leads may be plated with a tin material. The semiconductor device may further include a bond wire configured to conductively connect a bond pad on the semiconductor die with a lead of the plurality of leads. The plurality of leads and the die pad may be formed from a copper or copper alloy material.

In yet another embodiment, there is provided, a semiconductor device including a leadframe including a plurality of leads having a top side and a bottom side, each lead of the plurality of leads including an outer portion and an inner portion, the outer portion proximate to an outer perimeter of the leadframe, the inner portion half etched at the bottom side; an adhesive applied on the inner portion of the plurality of leads at the bottom side; a die pad having a top surface and a bottom surface, the top surface of the die pad attached to the plurality of leads by way of the adhesive; a semiconductor die attached to the top surface of the die pad by way of a die attach material; and a molding compound encapsulating the semiconductor die, a portion of the plurality of leads, and a portion of the die pad. The outer portion may have a first thickness and the inner portion may have a second thickness, the second thickness less than the first thickness. The outer portion may have a first length and the inner portion may have a second length, the first length less than the second length. The bottom surface of the die pad and the outer portion of each lead at the bottom side of the plurality of leads may be substantially coplanar and exposed through the molding compound.

By now it should be appreciated that there has been provided, a semiconductor device packaging leadframe assembly. The leadframe assembly includes a flagless (e.g., no die pad) package leadframe having long half-etched leads. A separate die pad is attached to an inner portion of the half-etched leads by way of a non-conductive adhesive material to form the leadframe assembly. A top surface of the die pad is downset from a top surface of the lead when the leadframe assembly is formed. A semiconductor die is attached at the top surface of the die pad allowing for shorter bond wire lengths when interconnected with leadframe leads. A bottom surface of the die pad is substantially coplanar with bottom portions of the leads and exposed after encapsulation. By attaching the die pad to the inner portion of the long half-etched leads in this manner, the long half-etch leads are reinforced. A bonding region at the top surface of the leads is sufficiently rigid to form highly reliable stitch bonds. The highly reliable stitch bonds allow for improved yields, lower costs, and greater overall reliability.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
   forming a package leadframe assembly comprising:
   providing a leadframe including a plurality of leads, the plurality of leads having a first major side and a second major side;
   applying an adhesive on a portion of the first major side of the plurality of leads;
   providing a die pad having a first major surface, a second major surface, and a length, wherein the first major surface is substantially flat across the length of the die pad;
   placing the first major surface of the die pad onto the adhesive, a portion of the die pad overlapping the portion of the first major side of the plurality of leads;
   attaching a semiconductor die to the first major surface of the die pad; and
   encapsulating with a molding compound the semiconductor die and a portion of the package leadframe assembly;
   wherein each lead of the plurality of leads includes a first portion at a first end of the lead proximate to an outer perimeter of the leadframe and a second portion extending from the first portion to a second end of the lead, the first portion having a first thickness and the second portion having a second thickness less than the first thickness,
   wherein the second portion of each lead of the plurality of leads is etched on the first major side to form the second thickness.

2. The method of claim 1, wherein applying the adhesive on the portion of the first major side of the plurality of leads is applying the adhesive on the second portion of the first major side of the plurality of leads.

3. The method of claim 1, wherein after placing the first major surface of the die pad onto the adhesive, the second major surface of the die pad is substantially coplanar with the first portion of each lead at the first major side of the plurality of leads.

4. The method of claim 1, further comprising connecting a bond pad on the semiconductor die with a lead of the plurality of leads by way of a bond wire.

5. The method of claim 1, further comprising after encapsulating with the molding compound, plating exposed surfaces of the plurality of leads and the die pad with a tin material.

6. The method of claim 1, wherein the plurality of leads and the die pad are formed from a copper or copper alloy material.

7. The method of claim 1, wherein the package leadframe assembly is configured for a quad flat no-lead (QFN) type package.

8. A semiconductor device comprising:
   a leadframe including a plurality of leads having a top side and a bottom side, an inner portion of each lead of the plurality of leads half etched at the bottom side;
   an adhesive applied on the inner portion of the plurality of leads at the bottom side;
   a die pad having a top surface, a bottom surface, and a length, the top surface of the die pad being substantially flat across the length of the die pad and attached to the plurality of leads by way of the adhesive;
   a semiconductor die attached to the top surface of the die pad; and
   a molding compound encapsulating the semiconductor die, a portion of the plurality of leads, and a portion of the die pad.

9. The semiconductor device of claim 8, wherein each lead of the plurality of leads further includes an outer portion adjacent to the inner portion and proximate to an outer perimeter of the leadframe, the outer portion having first thickness and the inner portion having a second thickness less than the first thickness.

10. The semiconductor device of claim 9, wherein the bottom surface of the die pad is substantially coplanar with the outer portion of each lead at the bottom side of the plurality of leads.

11. The semiconductor device of claim 9, wherein the bottom surface of the die pad and the outer portion of each lead at the bottom side of the plurality of leads are exposed through the molding compound.

12. The semiconductor device of claim 11, wherein the exposed surfaces of the die pad and outer portion of each lead at the bottom side of the plurality of leads are plated with a tin material.

13. The semiconductor device of claim 8, further comprising a bond wire configured to conductively connect a bond pad on the semiconductor die with a lead of the plurality of leads.

14. The semiconductor device of claim 8, wherein the plurality of leads and the die pad are formed from a copper or copper alloy material.

15. A semiconductor device comprising:
   a leadframe including a plurality of leads having a top side and a bottom side, each lead of the plurality of leads including an outer portion and an inner portion, the outer portion proximate to an outer perimeter of the leadframe, the inner portion half etched at the bottom side;
   an adhesive applied on the inner portion of the plurality of leads at the bottom side;
   a die pad having a top surface, a bottom surface, and a length, the top surface of the die pad being substantially flat across the length of the die pad and attached to the plurality of leads by way of the adhesive;
   a semiconductor die attached to the top surface of the die pad by way of a die attach material; and
   a molding compound encapsulating the semiconductor die, a portion of the plurality of leads, and a portion of the die pad.

16. The semiconductor device of claim 15, wherein the outer portion has a first thickness and the inner portion has a second thickness, the second thickness being less than the first thickness.

17. The semiconductor device of claim 15, wherein the outer portion has a first length and the inner portion has a second length, the first length being less than the second length.

18. The semiconductor device of claim 15, wherein the bottom surface of the die pad and the outer portion of each lead at the bottom side of the plurality of leads are substantially coplanar and exposed through the molding compound.

* * * * *